US012531526B2

(12) United States Patent
Melanson et al.

(10) Patent No.: US 12,531,526 B2
(45) Date of Patent: Jan. 20, 2026

(54) NON-LINEAR FUNCTION IN AN EARLY-SAMPLED HYBRID MULTI-LEVEL CONVERTER AMPLIFIER SYSTEM

(71) Applicant: Cirrus Logic International Semiconductor Ltd., Edinburgh (GB)

(72) Inventors: John L. Melanson, Austin, TX (US); Abhishek Mukherjee, Austin, TX (US); Lingli Zhang, Austin, TX (US); Zhaohui He, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 435 days.

(21) Appl. No.: 18/303,750

(22) Filed: Apr. 20, 2023

(65) Prior Publication Data

US 2023/0344394 A1 Oct. 26, 2023

Related U.S. Application Data

(60) Provisional application No. 63/439,400, filed on Jan. 17, 2023, provisional application No. 63/333,218, filed on Apr. 21, 2022.

(51) Int. Cl.
*H03F 3/217* (2006.01)
*H03F 1/02* (2006.01)
*H03F 1/32* (2006.01)

(52) U.S. Cl.
CPC ......... *H03F 3/2175* (2013.01); *H03F 1/0255* (2013.01); *H03F 1/3264* (2013.01); *H03F 2200/03* (2013.01); *H03F 2200/351* (2013.01)

(58) Field of Classification Search
CPC .... H03F 3/2175; H03F 1/0255; H03F 1/3264; H03F 2200/03; H03F 2200/351;
(Continued)

(56) References Cited

U.S. PATENT DOCUMENTS 12,166,456 B2 * 12/2024 Peting ................... H03F 1/3264
2012/0038500 A1 2/2012 Dijkmans et al.
(Continued)

OTHER PUBLICATIONS

International Search Report and Written Opinion of the International Searching Authority, International Application No. PCT/US2023/019335, mailed Aug. 17, 2023.
(Continued)

*Primary Examiner* — Hieu P Nguyen
(74) *Attorney, Agent, or Firm* — Jackson Walker L.L.P.

(57) ABSTRACT

A system may include an analog loop filter comprising a plurality of analog integrators, the analog loop filter configured to receive an analog signal input and a feedback output signal, at least one sampler for sampling outputs of the analog integrators, a second loop filter coupled between an output of an analog pulse-width modulation driver and a digital pulse-width modulation controller, wherein the second loop filter comprises at least one integrator and is configured to receive sampled outputs of the analog integrators from the at least one sampler and receive a feedback pulse-width modulation signal from the analog pulse-width modulation driver, and a correction subsystem configured to apply a non-linear function to a signal path of the second loop filter in order to compensate for non-linearity introduced as a result of sampling outputs of the analog integrators.

20 Claims, 12 Drawing Sheets

(58) Field of Classification Search
CPC ...... H03F 1/0211; H03F 3/183; H03F 3/2173; H03F 1/0227; H03M 3/432; H03M 3/494; H03K 7/08
USPC ........................................ 330/251, 10, 207 A
See application file for complete search history.

(56) References Cited

U.S. PATENT DOCUMENTS

2015/0288335 A1   10/2015  Hoyerby
2024/0088844 A1*   3/2024  Botti ..................... H03F 3/2173

OTHER PUBLICATIONS

Kinyua, Martin, et al., "Integrated 105 dB SNR, 0.0031% THD+N Class-D Audio Amplifier with Global Feedback and Digital Control in 55 nm CMOS", IEEE Journal of Solid-State Circuits, IEEE, USA, vol. 50, No. 8, May 8, 2015, pp. 1764-1771.

* cited by examiner

NON-LINEAR FUNCTION IN AN EARLY-SAMPLED HYBRID MULTI-LEVEL CONVERTER AMPLIFIER SYSTEM

RELATED APPLICATIONS

The present application claims priority to U.S. Provisional Patent Application No. 63/333,218 filed Apr. 21, 2022, and U.S. Provisional Patent Application No. 63/439,400 filed Jan. 17, 2023, both of which are incorporated by reference herein in their entireties.

FIELD OF DISCLOSURE

The present disclosure relates in general to circuits for audio devices, including without limitation personal audio devices, such as wireless telephones and media players, and more specifically, to systems and methods for compensation in a multi-level pulse-width modulation system.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a multi-level converter amplifier. A multi-level amplifier may be used to functionally implement a multi-supply voltage amplifier, in which one or both supply rails of the amplifier may be used in order to achieve greater power efficiency over single or constant power supply voltage architectures. One example of a multi-supply voltage amplifier is a Class-G amplifier. A Class-G amplifier may provide two or more power supplies at different voltages and switch between them as the signal output approaches each level. Thus, a Class-G amplifier may increase efficiency by reducing the wasted power at output driving transistors of the amplifier. In some instances, a Class-G amplifier may be supplied from both a positive power rail and a negative power rail, and each power rail may have a variable supply voltage selected from two or more power supply voltages. For example, each of the positive power rail and negative power rail may be variable among 0V, a battery voltage $V_P$, and two times a battery voltage $2V_P$, such that a fully-differential output of the Class-G amplifier may vary among 0V, $V_P$, $2V_P$, $3V_P$, and $4V_P$.

As is explained in greater detail below, a multi-level converter amplifier may suffer from non-linearities. Accordingly, systems and methods for compensating for such non-linearities may be desired.

SUMMARY

In accordance with the teachings of the present disclosure, one or more disadvantages and problems associated with using multi-level converter amplifiers with early sampling may be reduced or eliminated.

In accordance with embodiments of the present disclosure, a system may include an analog loop filter comprising a plurality of analog integrators, the analog loop filter configured to receive an analog signal input and a feedback output signal, at least one sampler for sampling outputs of the analog integrators, a second loop filter coupled between an output of an analog pulse-width modulation driver and a digital pulse-width modulation controller, wherein the second loop filter comprises at least one integrator and is configured to receive sampled outputs of the analog integrators from the at least one sampler and receive a feedback pulse-width modulation signal from the analog pulse-width modulation driver, and a correction subsystem configured to apply a non-linear function to a signal path of the second loop filter in order to compensate for non-linearity introduced as a result of sampling outputs of the analog integrators.

In accordance with embodiments of the present disclosure, a method may be provided for use in a system having an analog loop filter comprising a plurality of analog integrators, the analog loop filter configured to receive an analog signal input and a feedback output signal, at least one sampler for sampling outputs of the analog integrators, and a second loop filter coupled between an output of an analog pulse-width modulation driver and a digital pulse-width modulation controller, wherein the second loop filter comprises at least one integrator and is configured to receive sampled outputs of the analog integrators from the at least one sampler and receive a feedback pulse-width modulation signal from the analog pulse-width modulation driver. The method may include applying a non-linear function to a signal path of the second loop filter in order to compensate for non-linearity introduced as a result of sampling outputs of the analog integrators.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
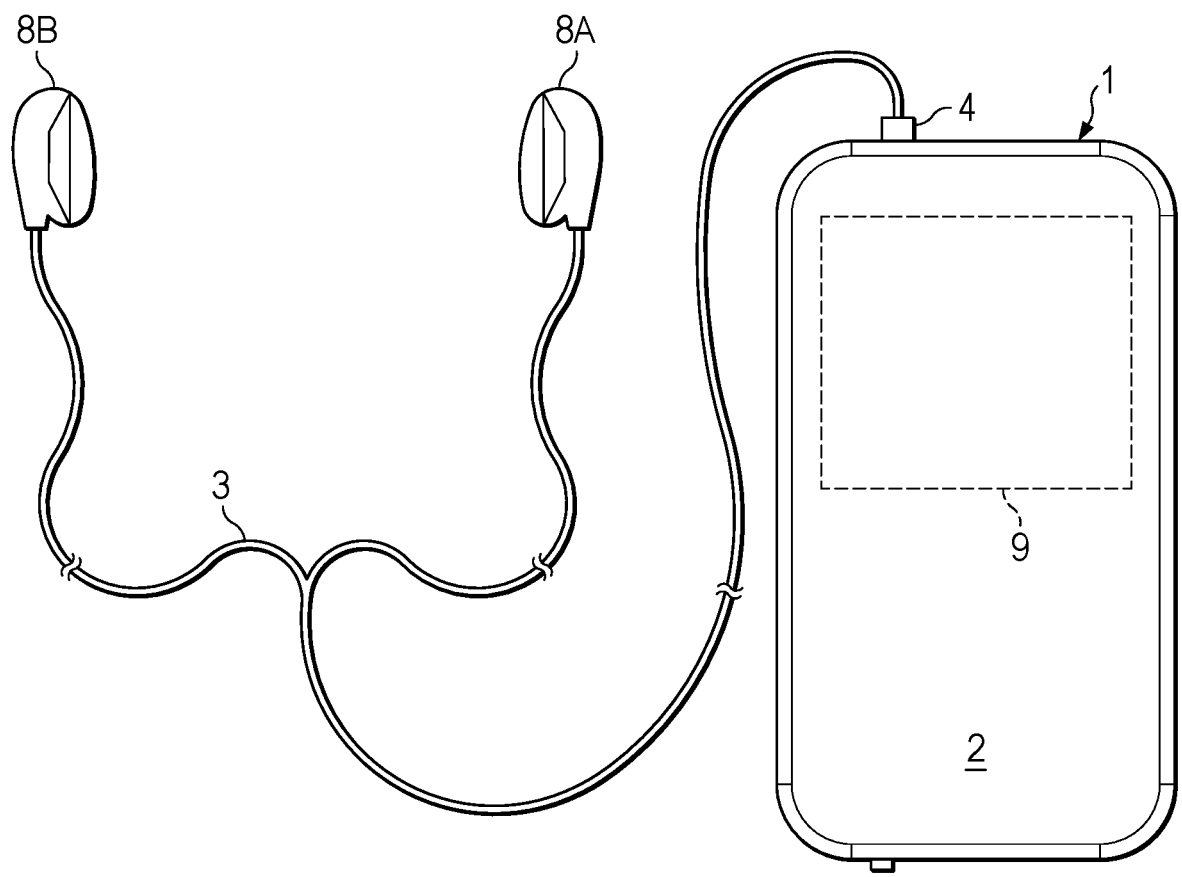
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
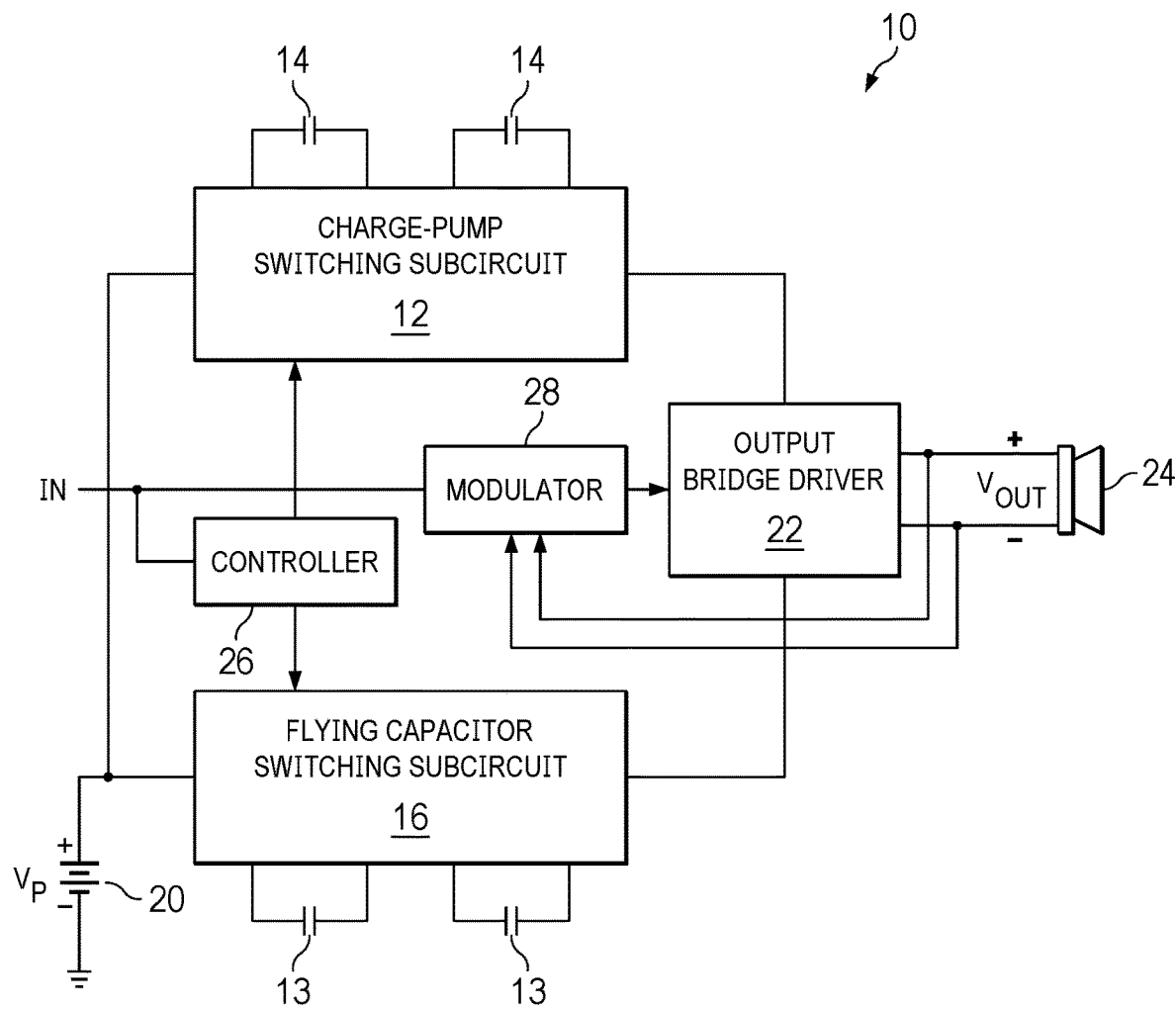
FIG. 2 illustrates a block diagram of selected components of an example audio integrated circuit of a personal audio device, in accordance with embodiments of the present disclosure.

FIG. 2 illustrates a block diagram of selected components of an example multi-level converter amplifier 10 of a personal audio device, in accordance with embodiments of the present disclosure. In some embodiments, multi-level converter amplifier 10 may be used to implement at least a portion of audio IC 9 of FIG. 1. As shown in FIG. 2, multi-level converter amplifier 10 may include a charge-pump switching subcircuit 12 coupled to charge-pump capacitors 14 and a flying capacitor switching subcircuit 16 coupled to flying-capacitors 13. Both of charge-pump switching subcircuit 12 and flying capacitor switching subcircuit 16 may be coupled to a battery 20 having a battery voltage $V_P$.

As also shown in FIG. 2, multi-level converter amplifier 10 may include a signal path including a modulator 28 and an output bridge driver 22. Modulator 28 may include any suitable system, device, or apparatus (e.g., a delta-sigma modulator) configured to receive audio input signal IN to generate a PWM signal. Output bridge driver 22 may receive and amplify such PWM signal to generate a differential analog output voltage $V_{OUT}$ driven to speaker 24. In some embodiments, output bridge driver 22 may comprise a Class-D or similar driver. A positive terminal of output bridge driver 22 may be supplied by charge-pump switching subcircuit 12 generating supply voltage $V_{SUPPLY}^+$ while a negative terminal of output bridge driver 22 may be supplied by flying capacitor switching subcircuit 16 generating supply voltage $V_{SUPPLY}^-$.

In operation, a controller 26 may, based on a magnitude of audio input signal IN, control switching of switches internal to charge-pump switching subcircuit 12 and flying capacitor switching subcircuit 16 in order to cause charge-pump switching subcircuit 12 and flying capacitor switching subcircuit 16 to generate desired supply voltages $V_{SUPPLY}^+$ and $V_{SUPPLY}^-$ for the terminals of output bridge driver 22. For example, based on a magnitude of audio input signal IN, controller 26 may cause charge-pump switching subcircuit 12 to output supply voltage $V_{SUPPLY}^+$ equivalent to either of battery voltage $V_P$ or two times the battery voltage $2V_P$. Further, when differential analog output voltage $V_{OUT}$ is near its peak, controller 26 may control switching of charge-pump switching subcircuit 12 such that supply voltage $V_{SUPPLY}^+$ varies between $V_P$ and $2V_P$, with the time allocation between $V_P$ and $2V_P$ modulated by a PWM duty cycle of audio input signal IN. Similarly, controller 26 may control switching of flying capacitor switching subcircuit 16 such that supply voltage $V_{SUPPLY}^-$ varies among 0, $-V_P$, and $-2V_P$, with the time allocation among 0, $-V_P$, and $-2V_P$ modulated by a PWM duty cycle of audio input signal IN.

As a result, multi-level output bridge driver 22 may independently modulate the signal components of each of its differential outputs between two of several voltage levels, separated by battery voltage $V_P$. For example, each differential output of output bridge driver 22 may switch between $V_P$ and $2V_P$, 0 and $V_P$, $-V_P$ and 0, and $-V_P$ and $-2V_P$, with switching patterns controlled by the signal level of audio input signal IN. As a result, output bridge driver 22 may support a fully differential range of $-4V_P$ to $4V_P$ for differential analog output voltage $V_{OUT}$, in the embodiments represented by FIG. 2.

Figure 3:
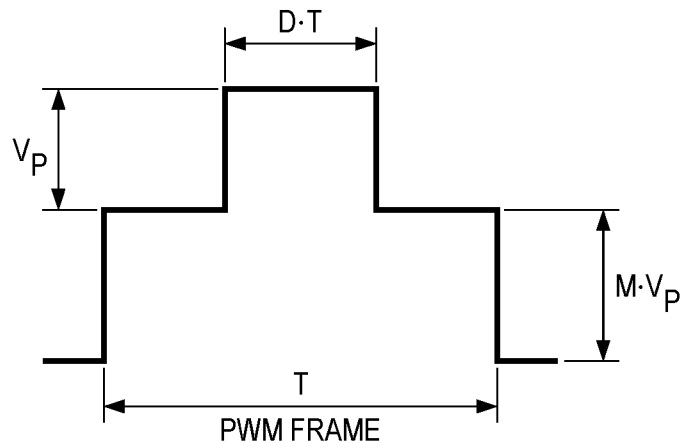
FIG. 3 illustrates a timing diagram of a single frame depicting the nature of a multi-level differential pulse width modulated output signal, in accordance with embodiments of the present disclosure.

In some embodiments, multi-level output bridge driver 22 may generate differential analog output voltage $V_{OUT}$ as a multi-level PWM pulse which may be viewed as a superposition of an integer portion and a fractional portion. The integer portion may be a fixed-width, variable-height pulse referred to herein as a "mode pulse" and the fractional portion may be a fixed-height, variable-width pulse referred to herein as a "PWM pulse." FIG. 3 illustrates a timing diagram of an example frame of a differential analog output voltage $V_{OUT}$, in accordance with embodiments of the present disclosure. As shown in FIG. 3, each frame of differential analog output voltage $V_{OUT}$ may have a sampling interval T, with an integer value mode M and duty cycle D for the PWM pulse. Throughout this disclosure, to simplify clarity and exposition, it may be assumed that battery voltage $V_P$ equals 1 (i.e., signal magnitudes are normalized to battery voltage $V_P$) and sampling interval T equals 1 (i.e., duty cycles are normalized to sampling interval T). Some signals may be represented with different mode and PWM duty cycle combinations, as shown in the table below.

| Signal (Normalized to $V_P$) | M | D |
|---|---|---|
| 2.5 | 3 | −0.5 |
| 2.5 | 2 | 0.5 |
| 1.5 | 2 | −0.5 |
| 1.5 | 1 | 0.5 |
| 0.5 | 1 | −0.5 |
| 0.5 | 0 | 0.5 |

Figure 4A:
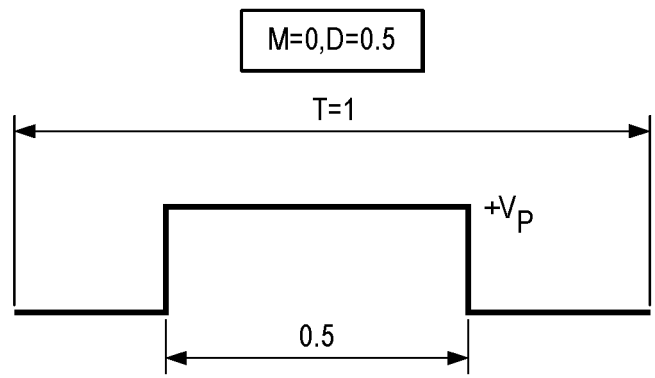
FIGS. 4A and 4B illustrate timing diagrams of a multi-level differential pulse width modulated output signal transitioning between modes, in accordance with embodiments of the present disclosure.
Figure 4B:
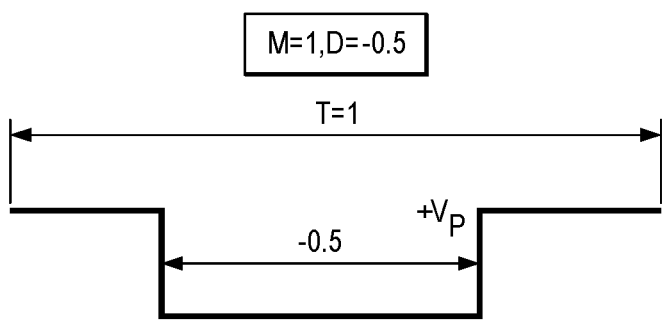

Accordingly, when differential analog output voltage $V_{OUT}$ is at a level at which it transitions between modes, the mode and duty cycle for differential analog output voltage $V_{OUT}$ may change. For example, FIGS. 4A and 4B illustrate a timing diagram of an example of a differential analog output voltage $V_{OUT}$ transitioning between modes, in accordance with embodiments of the present disclosure. As shown in FIG. 4A, when differential analog output voltage \Tour is at $0.5V_P$, such value may be represented by a mode M of 0 and a duty cycle D of 0.5. Thus, when increasing from a value just below $0.5V_P$ to a value above $0.5V_P$, differential analog output voltage $V_{OUT}$ at $0.5V_P$ may transition from being represented by a mode M of 0 and a duty cycle D of 0.5 as shown in FIG. 4A to being represented by a mode M of 1 and a duty cycle D of −0.5 as shown in FIG. 4B. Thus, while the value of M+D may remain the same across the transition, the shape of the pulse of differential analog output voltage $V_{OUT}$, which may be feedback to modulator 28, may change abruptly during mode transitions, leading to non-linearities.

Figure 5:
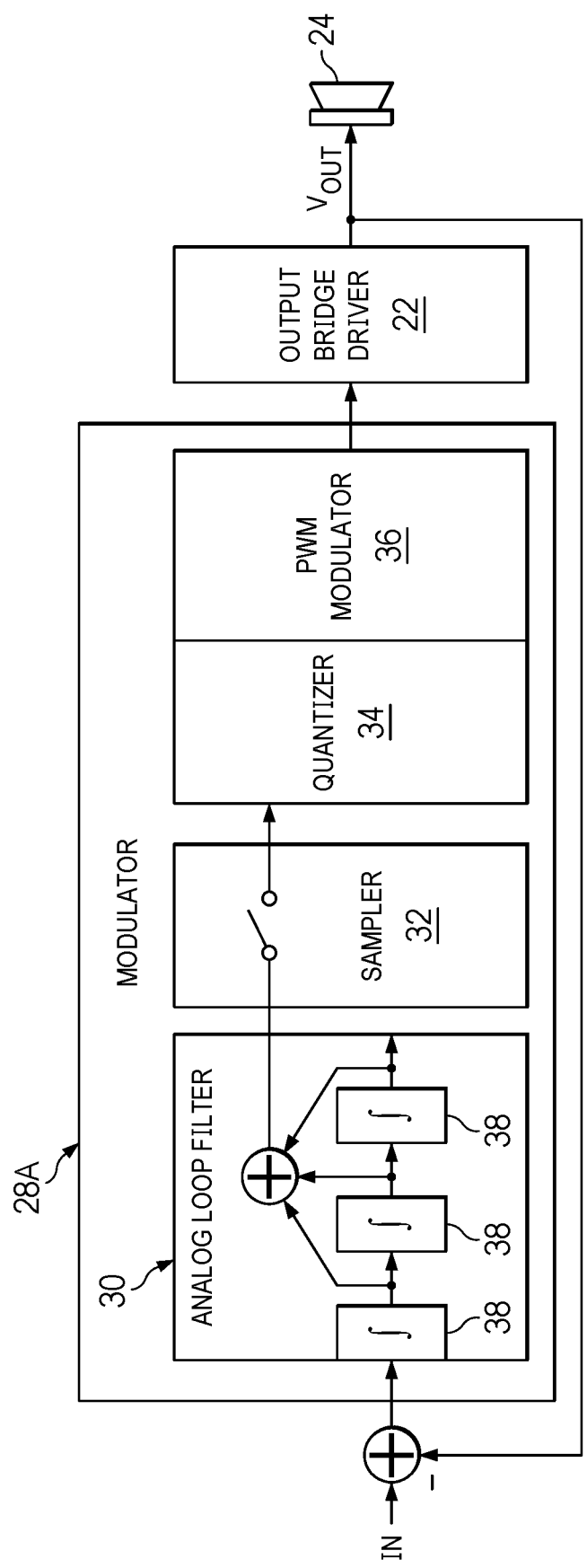
FIG. 5 illustrates an output bridge driver and selected components of a modulator having a third-order continuous-time analog loop filter, in accordance with embodiments of the present disclosure.

To attenuate such nonlinearity from the feedback of differential analog output voltage $V_{OUT}$ to modulator 28, modulator 28 may include a higher-order (e.g., $3^{rd}$ order or higher) loop filter. For example, FIG. 5 illustrates output bridge driver 22 and selected components of a modulator 28A (which may implement modulator 28) having a third-order continuous-time analog loop filter 30, followed by a sampler 32, a quantizer 34, and a PWM modulator 36, in accordance with embodiments of the present disclosure. As shown in FIG. 5, an error signal equal to the difference between audio input signal IN and differential analog output voltage $V_{OUT}$ may be filtered by a plurality of continuous-time integrators 38. The output of integrators 38 may be summed in the analog domain before being sampled by sampler 32 at the end of a frame, then fed to quantizer 34 in which it may be converted into mode M and duty cycle D. PWM modulator 36 may convert mode M and duty cycle D into a PWM waveform for receipt by output bridge driver 22.

Sampler 32 may comprise switched-capacitor sample and hold circuitry, or due to complexities of a PWM controller for output bridge driver 22, in some embodiments, sampler 32 may include an analog-to-digital converter (ADC). In alternative embodiments, an individual ADC may be placed after each of integrators 38.

Figure 6:
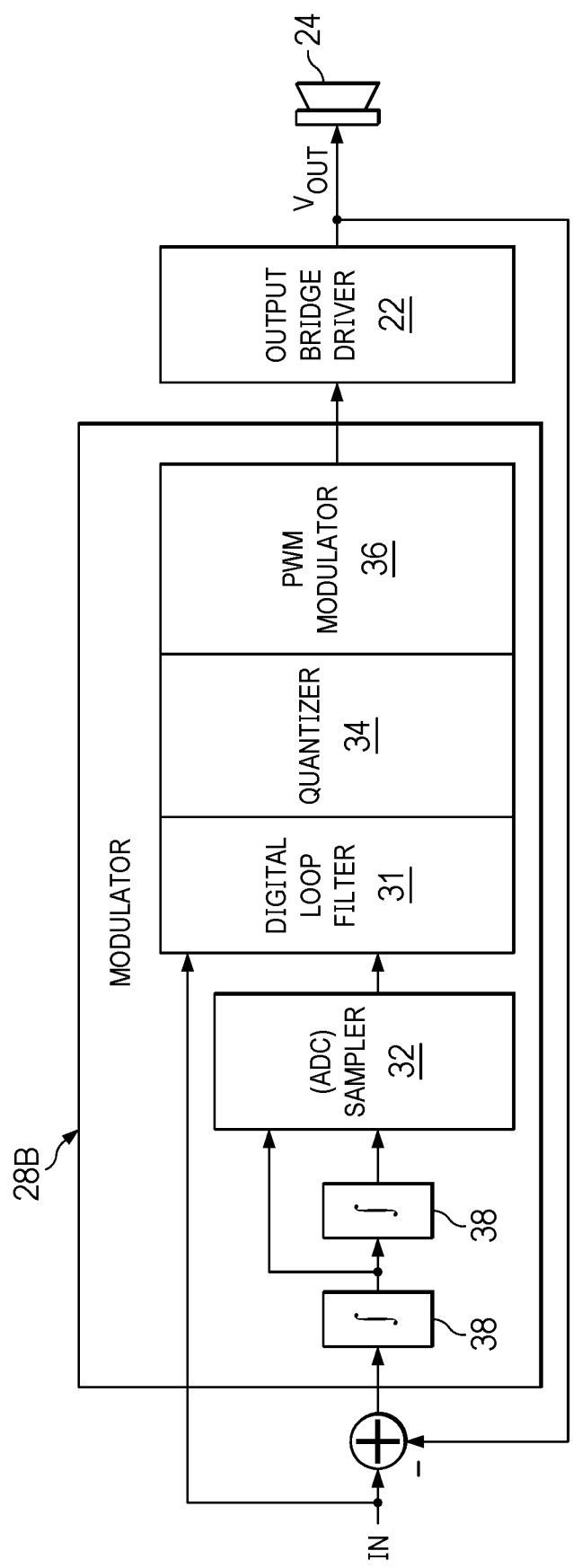
FIG. 6 illustrates an output bridge driver and selected components of a modulator having a second-order continuous-time analog loop filter with early sampling and a post-sampling higher-order digital loop filter, in accordance with embodiments of the present disclosure.

However, for a third-order system, a more area- and power-efficient and more flexible implementation may be to locate a sampler at the outputs of the lower-order integrators of the modulator and to minimize the number of sampling circuits in the signal path. For example, FIG. 6 illustrates output bridge driver 22 and selected components of a modulator 28B (which may implement modulator 28) having a second-order continuous-time analog loop filter in which sampler 32 (depicted as being implemented using an ADC) is located at the output of a lower integrator 38 (e.g., after the first or second integrator) within the signal path of modulator 28B. Other higher-order integrators of the loop filter (e.g., third-level or higher integrator) may be located downstream of the sampler 32 and may be implemented in the digital domain by a digital loop filter 31.

In the embodiments represented by FIG. 6, two early sampling events may occur. The first early sampling event may refer to sampling that occurs at two lower-order continuous-time integrators 38. It may be desired that such early sampling maintain higher-order noise shaping for any non-linearity of output bridge driver 22. The second early sampling event may refer to the sampling instant of the first integrator 38 of the signal path. To illustrate, because the sampling of the first two integrators 38 of the signal path may be time-multiplexed through a single ADC (e.g., sampler 32), if the second integrator 38 is chosen to be sampled at the end of a PWM frame in order to maintain matching with its digital counterpart, then the first integrator 38 may be sampled before the end of a PWM frame so that the output of the first integrator 38 may be used to update state variables of the feedback loop at the end of the same PWM frame. Sampling the first continuous integrator "before" the end of the PWM frame may introduce an error in the sampled response, which may undesirably impact the system's noise transfer function (and hence stability).

In accordance with the methods and systems disclosed herein, non-linear functions may be added within a loop to accomplish two "different" objectives, namely: (1) to achieve higher-order shaping of the non-linearity of the multi-level PWM pulse, despite sampling after only two continuous integrators; and (2) to correct for errors in the impulse response caused by sampling the first continuous integrator "before" the end of the PWM frame.

Achieving Higher Order Shaping

To aid in illustration of the impact of locating early sampling at lower-order continuous-time integrators 38, mode M=0 and duty cycle D=0.5 are chosen for illustrative purposes. However, the following discussion may apply for any arbitrary mode M and duty cycle D.

Figure 7:
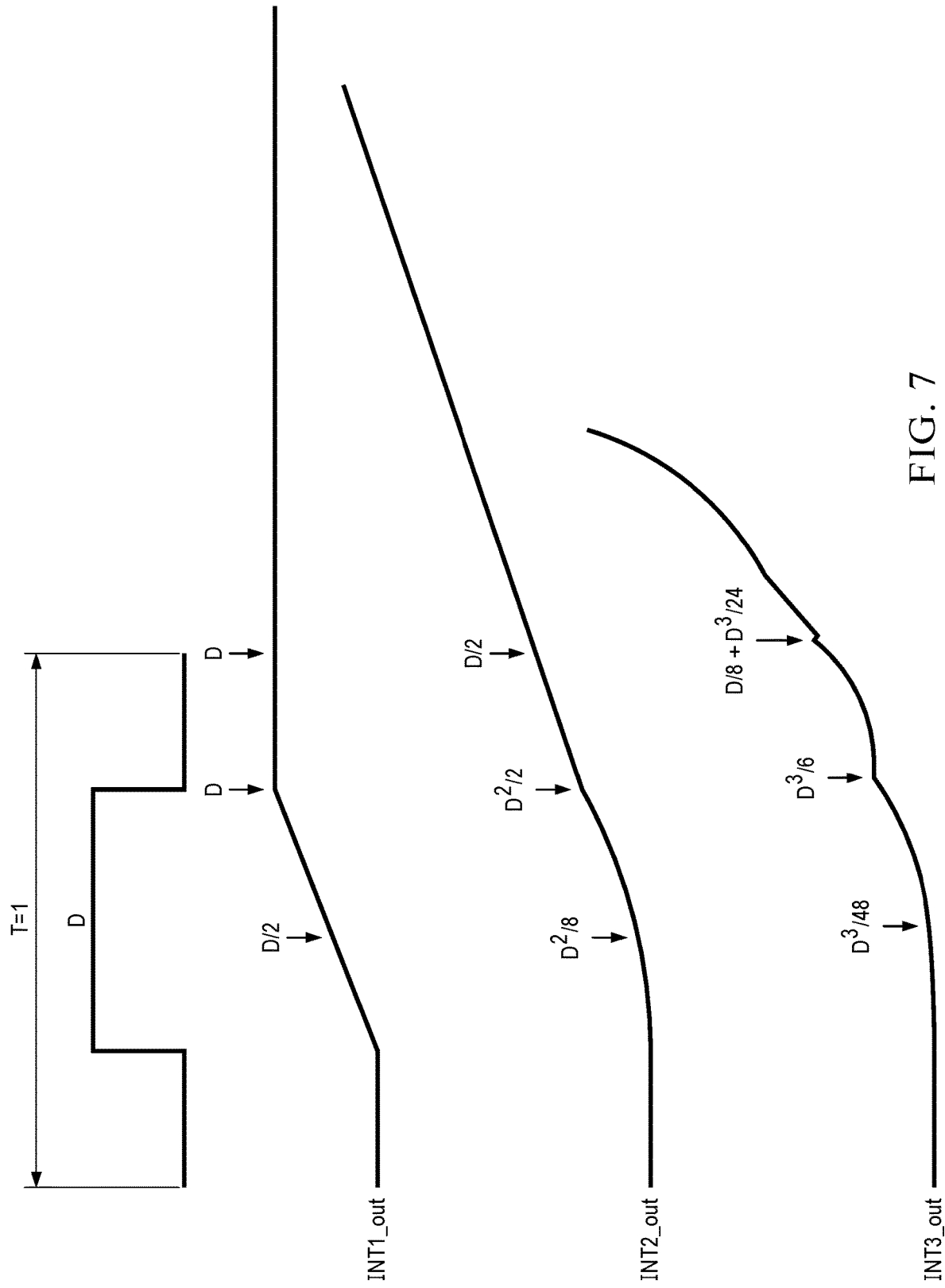
FIG. 7 illustrates example waveforms for sampling and processing of a signal through the modulator depicted in FIG. 5, in accordance with embodiments of the present disclosure.

FIG. 7 illustrates example waveforms for sampling and processing of a signal through modulator 28A depicted in FIG. 5, in accordance with embodiments of the present disclosure. In particular, FIG. 7 illustrates a signal value at the outputs INT1_out, INT2_out, and INT3_out of each of continuous-time integrators 38 of modulator 28A. For example, as shown in FIG. 7, if outputs are sampled at the mid-point of a PWM frame, the values of INT1_out, INT2_out, and INT3_out may be $D/2$, $D^2/8$, and $D^3/48$, respectively. If outputs are sampled at the end of a PWM frame, the values of INT1_out, INT2_out, and INT3_out may be D, $D/2$, and $D/8+D^3/24$, respectively.

In the example of FIG. 7, the sampled values at the midpoint and end of each sample period are based on a positive duty cycle at mode M=0. In general, for any linear combination of M+D (wherein D may be negative), the result from M may be treated as D=1 with scalar M. Therefore, the endpoint values from the mode pulse for INT1_out, INT2_out, and INT3_out may be M, M/2, and M/8+M/24, respectively. Results of a negative duty cycle D may be similar to that shown in FIG. 7, with the small difference that when duty cycle D is negative, all square terms will equal $\text{sign}(D) \cdot D^2$.

When all of the derived equations are applied to two scenarios, namely, (M=0, D=0.5) and (M=1, D=−0.5), the values at the end of a sample period may be as shown in the table below.

| | INT1_OUT | INT2_OUT | INT3_OUT |
|---|---|---|---|
| M = 0, D = 0.5 | M + D = 0.5 | (M + D)/2 = 0.5/2 | (M + D)/8 + $D^3$/24 + M/24 = 0.5/8 + $0.5^3$/24 |
| M = 1, D = −0.5 | M + D = 0.5 | (M + D)/2 = 0.5/2 | (M + D)/8 + $D^3$/24 + M/24 = 0.5/8 − $0.5^3$/24 + 1/24 |

Figure 8:
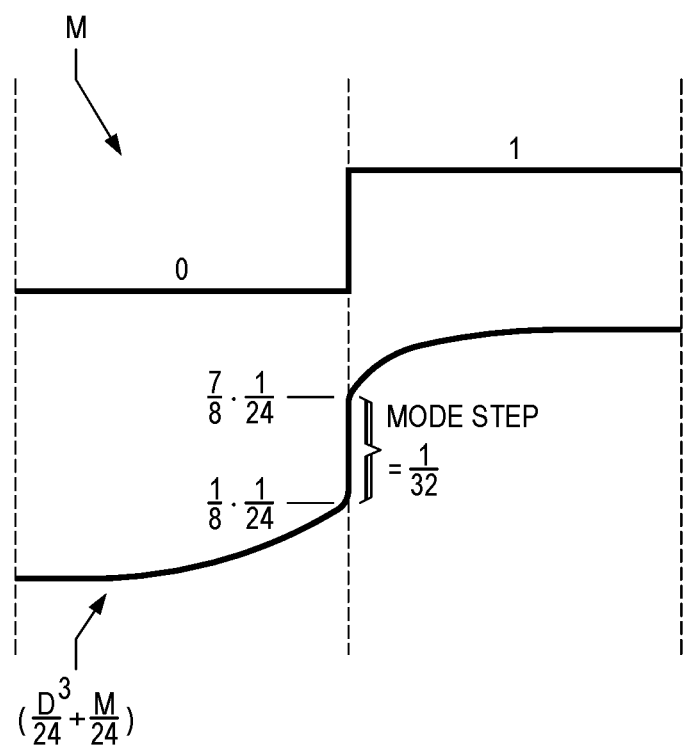
FIG. 8 illustrates a non-linear discontinuity occurring during mode transition when sampling the output of the third integrator of the modulator depicted in FIG. 5, in accordance with embodiments of the present disclosure.

As seen from the above table, for any arbitrary M and D, the sampled output of the third continuous integrator (INT3_OUT), when sampled at the end of the frame, has a non-linear term of $D^3/24+M/24$. Thus, with respect to sampling of the outputs of integrators 38 in the embodiments represented by FIG. 5, a considerable non-linear discontinuity of the third integrator output INT3_OUT in the amount 1/32 occurs when transitioning from mode M=0 to mode M=1, as shown in FIG. 8. Notably, however, the sampled output of the cascade of the first two continuous integrators, when sampled at the end of a PWM frame, includes only a linear term in M+D, and there is no discontinuity in the value of M+D.

Accordingly, sampling the second continuous integrator at a frame boundary may not capture this mode transition-induced nonlinearity. As an example, FIG. 6 depicts a system (e.g., modulator 28B) with two continuous integrators 38. The second integrator 38 may be sampled and then fed into subsequent (discrete) integrators, which may be implemented in the digital domain. These discrete integrators may be incorporated within digital loop filter 31 shown in FIG. 6. As already discussed above, when sampled at the boundary of the PWM frame, the sampled output of the second continuous integrator (INT2_OUT) may only consist of linear terms. Thus, any subsequent discrete integrator that receives the frame-boundary samples of INT2_OUT may not be able to observe the mode-transition discontinuity and may hence not be able to correct for such discontinuity.

Consequently, when sampling the second integrator 38 at the boundary of the PWM frame as shown in the embodiments represented by FIG. 6, the non-linearity caused by this abrupt change in the shape of multi-level PWM pulse would only be second-order shaped since it would not benefit from the feedback loop's third integrator. In such a scenario, the harmonics of the mode transition that appear in the output signal spectrum may cause a notable degradation in linearity that may impact all signal levels. As described in greater detail below, to minimize performance degradation due to having only two continuous integrators 38, embodiments of the present disclosure may include a non-linear function added at the input of the digital portion of the loop filter, in order to generate the same non-linear term as that present in the higher-order continuous time system to maintain higher-order noise shaping of the non-linear feedback pulse. The addition of the non-linear function may aid in minimizing in-band distortion observed at the output of speaker 24.

The systems and methods described herein may also address a correction for the error caused by early-sampling of the first continuous-time integrator 38, that is, the error caused by sampling the first continuous integrator (e.g., INT1_OUT in FIG. 7) "before" the end of the PWM frame. Although such errors in INT1_OUT may not significantly impact the in-band linearity of modulator 28B, they do impact the overall system stability and the system's transient response, especially during mode transitions.

Both the in-band distortion issue, as well as the error caused by the early sampling of the first integrator, can be addressed by adding various non-linear correction terms within the digital portion of the loop filter. Described below are three approaches for implementing an addition of a non-linear function within a digital portion of a loop filter. In the first approach, an explicit digital correction term may be added before the feedback loop's third (discrete-time) integrator. In the second approach, the feedback loop's second (continuous-time) integrator may be sampled numerous times, with a combination of these samples received by the feedback loop's third (discrete-time) integrator. In the third approach, a non-linear function is added to address early sampling of the feedback loop's first (continuous-time) integrator. The first two approaches may assist in achieving higher-order shaping of the feedback pulse's non-linearity. The third approach may assist in enhancing the system's stability and high-frequency transient response by restoring the impulse response of the first order path.

Figure 9:
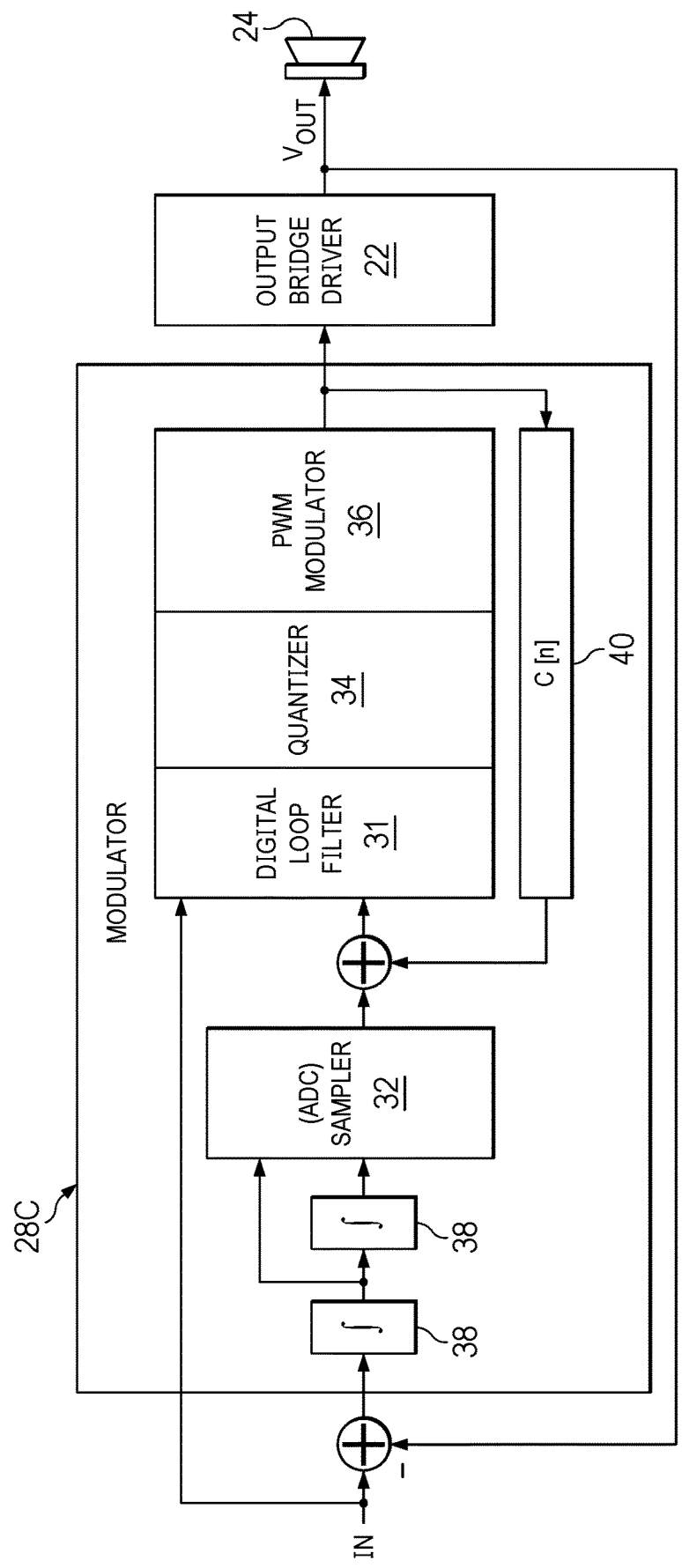
FIG. 9 illustrates an output bridge driver and selected components of a modulator having a second-order continuous-time analog loop filter with early sampling and a post-sampling higher-order digital loop filter having a non-linear correction function added thereto, in accordance with embodiments of the present disclosure.

FIG. 9 illustrates an output bridge driver 22 and selected components of a modulator 28C having a second-order continuous-time analog loop filter with early sampling and a post-sampling higher-order digital loop filter 31 having a non-linear correction function 40 added thereto, in accordance with embodiments of the present disclosure. Modulator 28C depicted in FIG. 9 may be similar in many respects to modulator 28B of FIG. 6, and thus, only certain differences between modulator 28C and modulator 28B may be described below.

For instance, modulator 28C may include non-linear correction function 40 which may be applied to the output of PWM modulator 36 with the result added to the output of sampler 32 before being received by a higher-order integrator of digital loop filter 31. As explained above, when sampled at the end of a PWM frame, the sampled output of the second continuous-time integrator 38 may include only terms that are linear with respect to the output of quantizer 34. Thus, to cause the output of the feedback loop's third (discrete time) integrator, present within digital loop filter 31, to be equivalent to what the sampled output of the third integrator would have been if implemented as an analog continuous-time integrator, non-linear correction function 40 may apply a correction term c[n] to the output of PWM modulator 36 and added to the input of the feedback loop's third integrator. In accordance with the examples described above with respect to FIGS. 5 and 6, such correction term may be $c[n]=D^3/24+M/24$. As a result, addition of non-linear correction term c[n] to the input of a third integrator of a feedback loop, wherein the third integrator is implemented as a discrete-time digital integrator, may achieve third-order shaping of the non-linearity from the multi-level PWM pulse.

Figure 10:
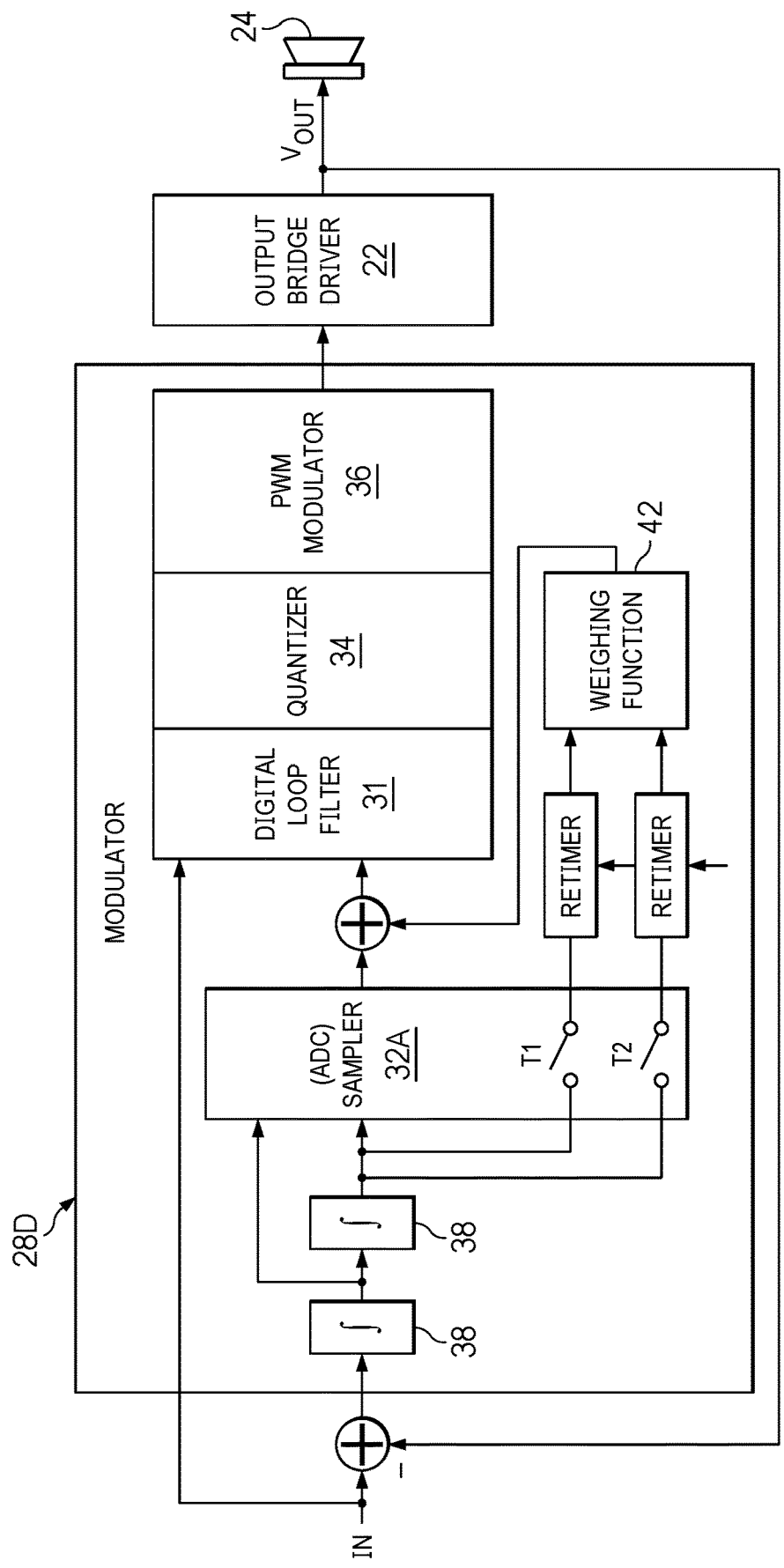
FIG. 10 illustrates an output bridge driver and selected components of a modulator having a second-order continuous-time analog loop filter with early sampling and a post-sampling higher-order digital loop filter, wherein correction is applied on the basis of multiple sample points of the output of the second-order continuous-time analog loop filter, in accordance with embodiments of the present disclosure.

FIG. 10 illustrates an output bridge driver 22 and selected components of a modulator 28D having a second-order continuous-time analog loop filter with early sampling and a post-sampling higher-order digital loop filter 31, wherein correction is applied on the basis of multiple sample points of the output of second continuous-time integrator 38, in accordance with embodiments of the present disclosure. Modulator 28D depicted in FIG. 10 may be similar in many respects to modulator 28C of FIG. 9, and thus, only certain differences between modulator 28D and modulator 28C may be described below.

In modulator 28D, sampler 32A (used in lieu of sampler 32 of modulator 28C) may take multiple samples of the output of the second integrator 38 during a single PWM frame in order to implement a non-linear function. Referring again to FIG. 7, it is seen that when sampled at the midpoint of a PWM frame, integrator output signal INT2_OUT includes a term $\text{sign}(D) \cdot D^2/8 + M/8$, whose time-domain behavior across mode transition boundaries is quite similar to that of $c[n]=D^3/24+M/24$. For example, a mode transition-induced discontinuity in $\text{sign}(D) \cdot D^2/8 + M/8$ may be 2/32, which is twice the mode transition-induced continuity in $D^3/24+M/24$. Thus, if the input of the feedback loop's third integrator (implemented digitally within digital loop filter 31) is set to be a particular combination of the mid-frame sample (at time T1) and end-frame sample (at time T2) of integrator output signal INT2_OUT, then, even without adding any explicit correction term, the mode transition-induced discontinuity added in modulator 28D may be matched to $c[n]=D^3/24+M/24$. Thus, inputting into the third integrator a weighted combination (as generated by a weighting function 42) of the mid-frame sample (at time T1) and end-frame sample (at time T2) of integrator output signal INT2_OUT may provide non-linearity correction that approximates that of modulator 28C of FIG. 9.

Correcting for Errors in the Impulse Response

Figure 11:
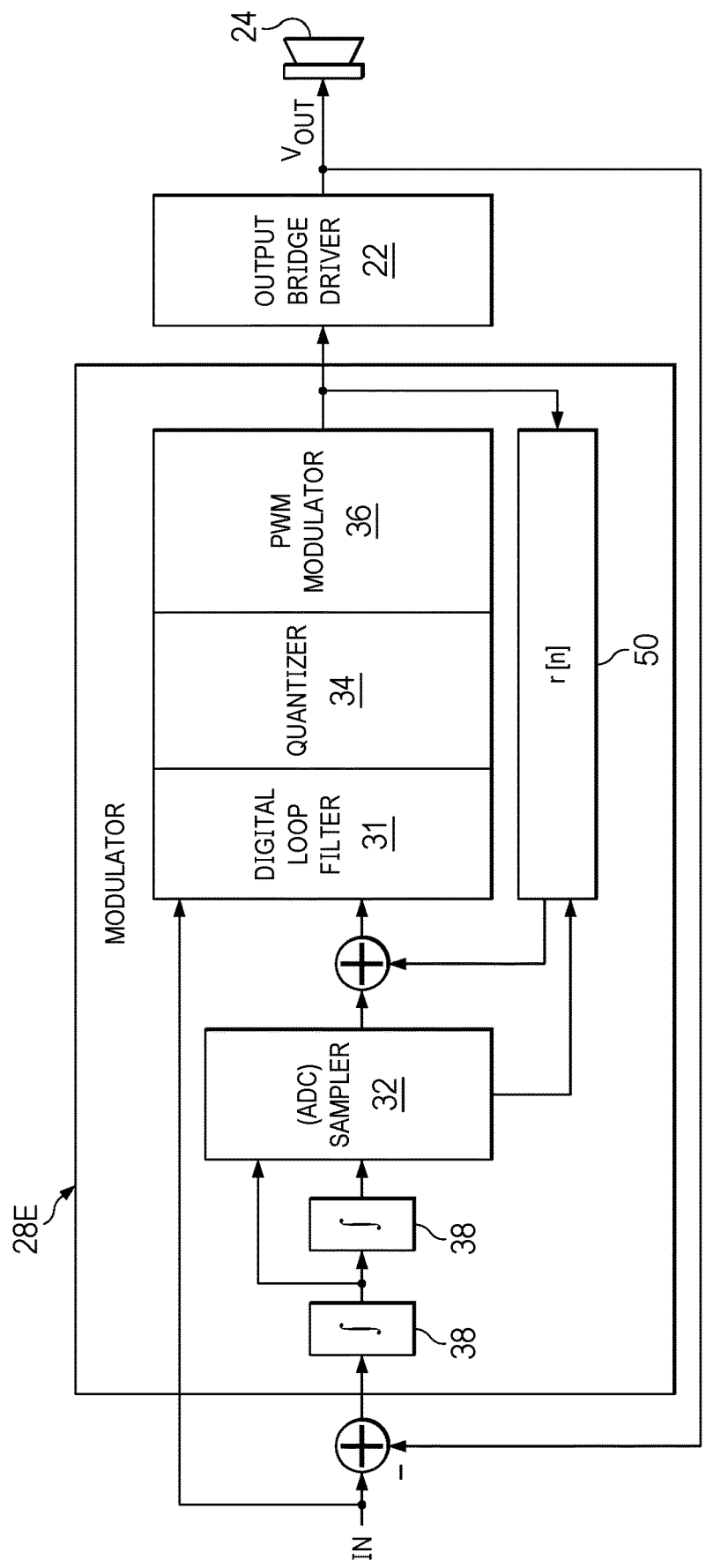
FIG. 11 illustrates an output bridge driver and selected components of a modulator having a second-order continuous-time analog loop filter with early sampling and a post-sampling higher-order digital loop filter, wherein non-linear correction is applied to compensate for early sampling of the first integrator of the feedback loop, in accordance with embodiments of the present disclosure.

FIG. 11 illustrates an output bridge driver 22 and selected components of a modulator 28E having a second-order continuous-time analog loop filter with early sampling and a post-sampling higher-order digital loop filter 31, wherein a non-linear function is applied to compensate for early sampling of the first integrator of the feedback loop, in accordance with embodiments of the present disclosure. Modulator 28E depicted in FIG. 11 may be similar in many respects to modulator 28C of FIG. 9, and thus, only certain differences between modulator 28E and modulator 28C may be described below.

For example, as shown in FIG. 11, modulator 28E may, in lieu of non-linear correction function 40, apply a non-linear correction function 50 with a correction term r[n] to a feedback signal output by PWM modulator 36 which is based at least in part on the sampled output of the first integrator 38 by sampler 32. To illustrate, because the output of the first continuous-time integrator 38 may be sampled before the end of a PWM frame (e.g., at a time instant t=T0), the output INT1_OUT of the first integrator 38 may have an error which is a function of mode M and duty cycle D. The nature of the error may be different between the mode pulse and the PWM pulse. When the mode pulse is processed by the first continuous-time integrator 38 and then sampled at time t=T0, the sampled output INT1_OUT may have an error which is proportional to the shaded area shown in FIG. 12.

Figure 12:
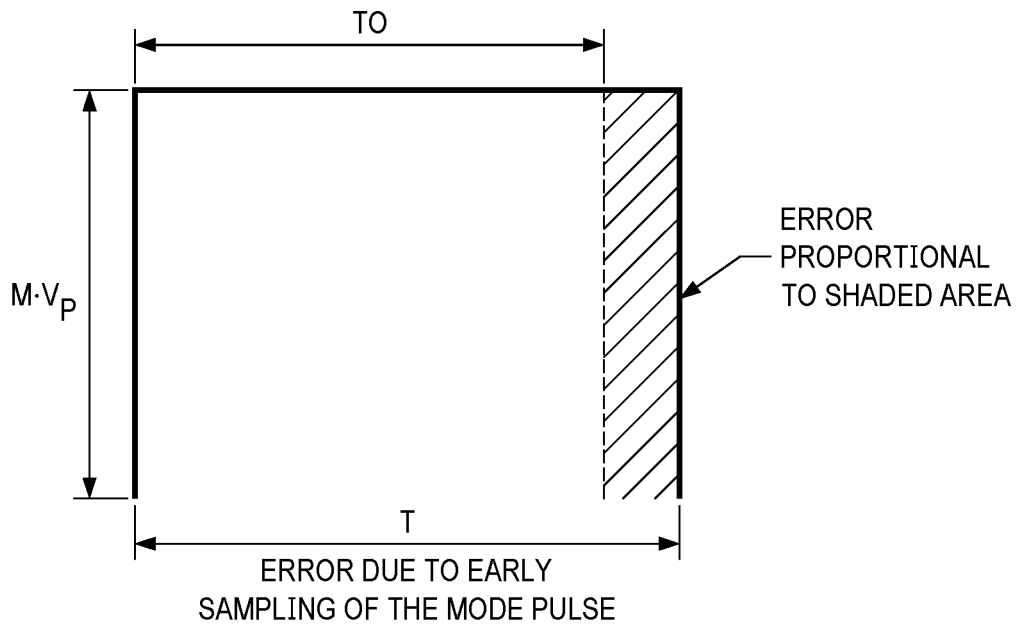
FIG. 12 illustrates a waveform of a multi-level pulse-width modulation frame of a signal depicting an error due to early sampling of the mode pulse, in accordance with embodiments of the present disclosure.
Figure 13:
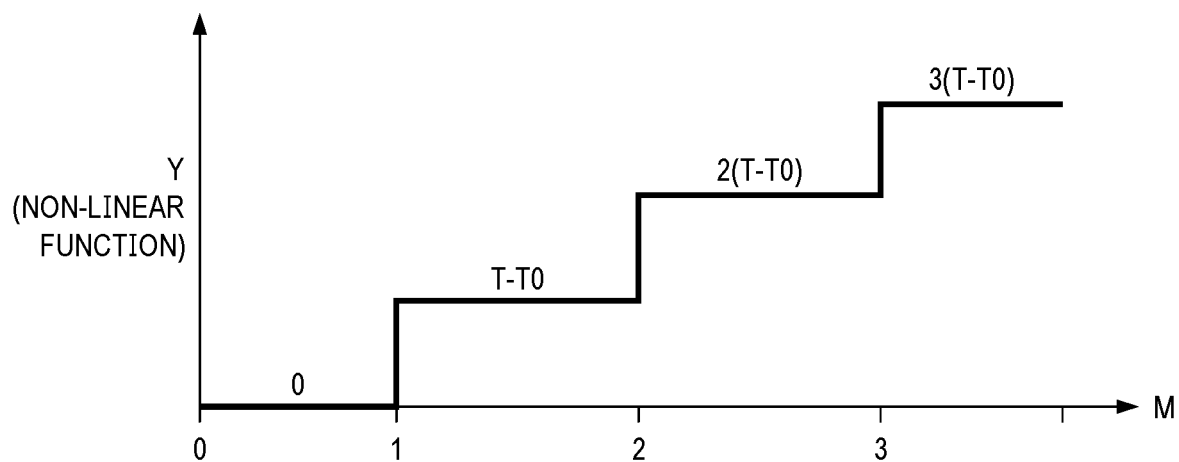
FIG. 13 illustrates a waveform of a non-linear function of a mode pulse of a multi-level pulse-width modulation frame, in accordance with embodiments of the present disclosure.

As shown in FIG. 12, at time t=T0, the output of the first continuous-time integrator 38 has not yet reached its final value. Thus, sampling the output of the first continuous integrator at time t=T0 introduces an error E=M(T−T0). To compensate for this error, a correction term equal to M(T−T0) must be added to the sampled output of first continuous-time integrator 38. The nature of this error is plotted in FIG. 13. For simplicity, the subsequent analyses will assume T=1 and that T0 is a fraction which is normalized to T. Under this assumption, the correction for the mode can be re-written as M(1−T0).

Figure 14A:
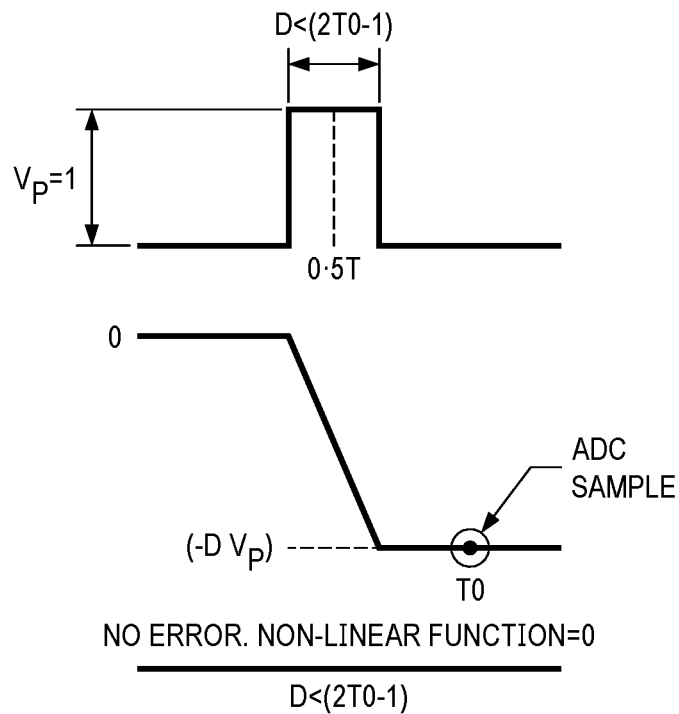
FIG. 14A illustrates a waveform of a multi-level pulse-width modulation frame of a signal with no errors, in accordance with embodiments of the present disclosure.
Figure 14B:
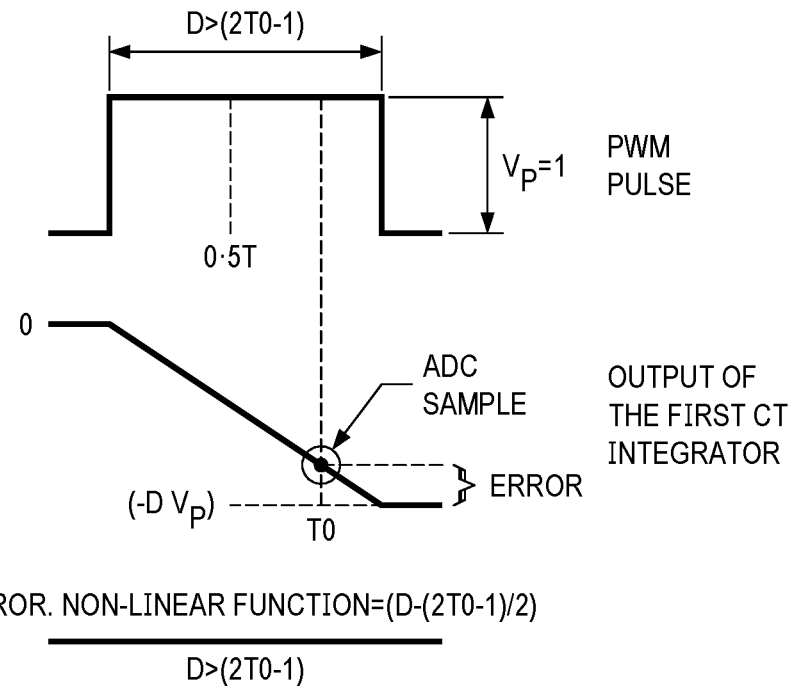
FIG. 14B illustrates a waveform of a multi-level pulse-width modulation frame of a signal depicting an error that could potentially arise due to early sampling of the PWM portion of the differential multi-level pulse, in accordance with embodiments of the present disclosure.

To correct for the PWM pulse, the pulse width |D| of the PWM pulse may be determined to have either a first condition in which |D|<(2T0−1) or a second condition in which |D|>(2T0−1). In the first condition, the output INT1_OUT of the first continuous-time integrator may reach its final value before the sampling instant T0 as shown in FIG. 14A. Thus, in this first condition, no correction may be required. However, in the second condition, the output INT1_OUT of the first continuous-time integrator may reach its final value after the sampling instant T0 as shown in FIG. 14B. Thus, in the second condition, an error E=0.5[D−(2T0−1)] may be introduced into the impulse response sample at n=1. Such error E may be corrected by applying a non-linear correction sequence defined by −0.5[D−(2T0−1)] δ[n−1]. Similarly, when duty cycle D<−(2T0−1), such error may be corrected by applying a non-linear correction sequence defined by −0.5[D+(2T0−1)] δ[n−1].

Combining results for the mode portion and the PWM portion of the feedback pulse, the correction term r[n] that may be applied to the raw output samples of the output INT1_OUT of the first continuous-time integrator 38 to correct for early sampling of the first continuous-time integrator 38 may be given by:

$$r[n] = \{-(1 - T0)M\}\delta[n - 1] \text{ when } -(2T0 - 1) < D < (2T0 - 1)$$

$$= \{-(1 - T0)M\} - 0.5(D - (2T0) - 1)\delta[n - 1] D > (2T0 - 1)$$

$$= \{-(1 - T0)M\} - 0.5(D + (2T0) - 1)\delta[n - 1] D < -(2T0 - 1)$$

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
an analog loop filter comprising a plurality of analog integrators, the analog loop filter configured to receive an analog signal input and a feedback output signal;
at least one sampler for sampling outputs of the analog integrators;
a second loop filter coupled between an output of an analog pulse-width modulation driver and a digital pulse-width modulation controller, wherein the second loop filter comprises at least one integrator and is configured to:
receive sampled outputs of the analog integrators from the at least one sampler; and
receive a feedback pulse-width modulation signal from the analog pulse-width modulation driver; and
a correction subsystem configured to apply a non-linear function to a signal path of the second loop filter in order to compensate for non-linearity introduced as a result of sampling outputs of the analog integrators.

2. The system of claim 1, wherein the at least one sampler is configured to independently sample outputs of the analog integrators.

3. The system of claim 1, wherein the at least one sampler comprises at least one analog-to-digital converter.

4. The system of claim 3, wherein the at least one analog-to-digital converter is configured to independently sample outputs of the analog integrators.

5. The system of claim 3, wherein the at least one analog-to-digital converter samples multiple samples of the outputs of the analog integrators during each pulse-width modulation frame associated with the signal path of the analog signal input.

6. The system of claim 1, wherein the non-linear function applies a correction term to the feedback pulse-width modulation signal to provide higher-order noise shaping in the signal path of the analog signal input.

7. The system of claim 1, wherein:
the plurality of analog integrators comprises a first analog integrator configured to receive an error signal based on the analog signal input and the feedback output signal and a second analog integrator configured to receive an output of the first analog integrator; and
the non-linear function is based on multiple samples of the second analog integrator sampled during each pulse-width modulation frame associated with the signal path of the analog signal input.

8. The system of claim 7, wherein the non-linear function is based on weights applied to each of the multiple samples.

9. The system of claim 1, wherein:
the plurality of analog integrators comprises a first analog integrator configured to receive an error signal based on the analog signal input and the feedback output signal and a second analog integrator configured to receive an output of the first analog integrator; and
the non-linear function applies a correction term to sampled output of the first analog integrator.

10. The system of claim 1, wherein:
the second loop filter is a digital loop filter; and
the at least one integrator of the digital loop filter comprises at least one digital integrator.

11. A method comprising, in a system having an analog loop filter comprising a plurality of analog integrators, the analog loop filter configured to receive an analog signal input and a feedback output signal, at least one sampler for sampling outputs of the analog integrators, and a second loop filter coupled between an output of an analog pulse-width modulation driver and a digital pulse-width modulation controller, wherein the second loop filter comprises at least one integrator and is configured to receive sampled outputs of the analog integrators from the at least one sampler and receive a feedback pulse-width modulation signal from the analog pulse-width modulation driver:
applying a non-linear function to a signal path of the second loop filter in order to compensate for non-linearity introduced as a result of sampling outputs of the analog integrators.

12. The method of claim 11, wherein the at least one sampler is configured to independently sample outputs of the analog integrators.

13. The method of claim 11, wherein the at least one sampler comprises at least one analog-to-digital converter.

14. The method of claim 13, wherein the at least one analog-to-digital converter is configured to independently sample outputs of the analog integrators.

15. The method of claim 13, wherein the at least one analog-to-digital converter samples multiple samples of the outputs of the analog integrators during each pulse-width modulation frame associated with the signal path of the analog signal input.

16. The method of claim 11, wherein the non-linear function applies a correction term to the feedback pulse-width modulation signal to provide higher-order noise shaping in the signal path of the analog signal input.

17. The method of claim 11, wherein:
the plurality of analog integrators comprises a first analog integrator configured to receive an error signal based on the analog signal input and the feedback output signal and a second analog integrator configured to receive an output of the first analog integrator; and
the non-linear function is based on multiple samples of the second analog integrator sampled during each pulse-width modulation frame associated with the signal path of the analog signal input.

18. The method of claim 17, wherein the non-linear function is based on weights applied to each of the multiple samples.

19. The method of claim 11, wherein:
the plurality of analog integrators comprises a first analog integrator configured to receive an error signal based on the analog signal input and the feedback output signal and a second analog integrator configured to receive an output of the first analog integrator; and
the non-linear function applies a correction term to sampled output of the first analog integrator.

20. The method of claim 11, wherein:
the second loop filter is a digital loop filter; and
the at least one integrator of the digital loop filter comprises at least one digital integrator.

* * * * *